Figure 1:
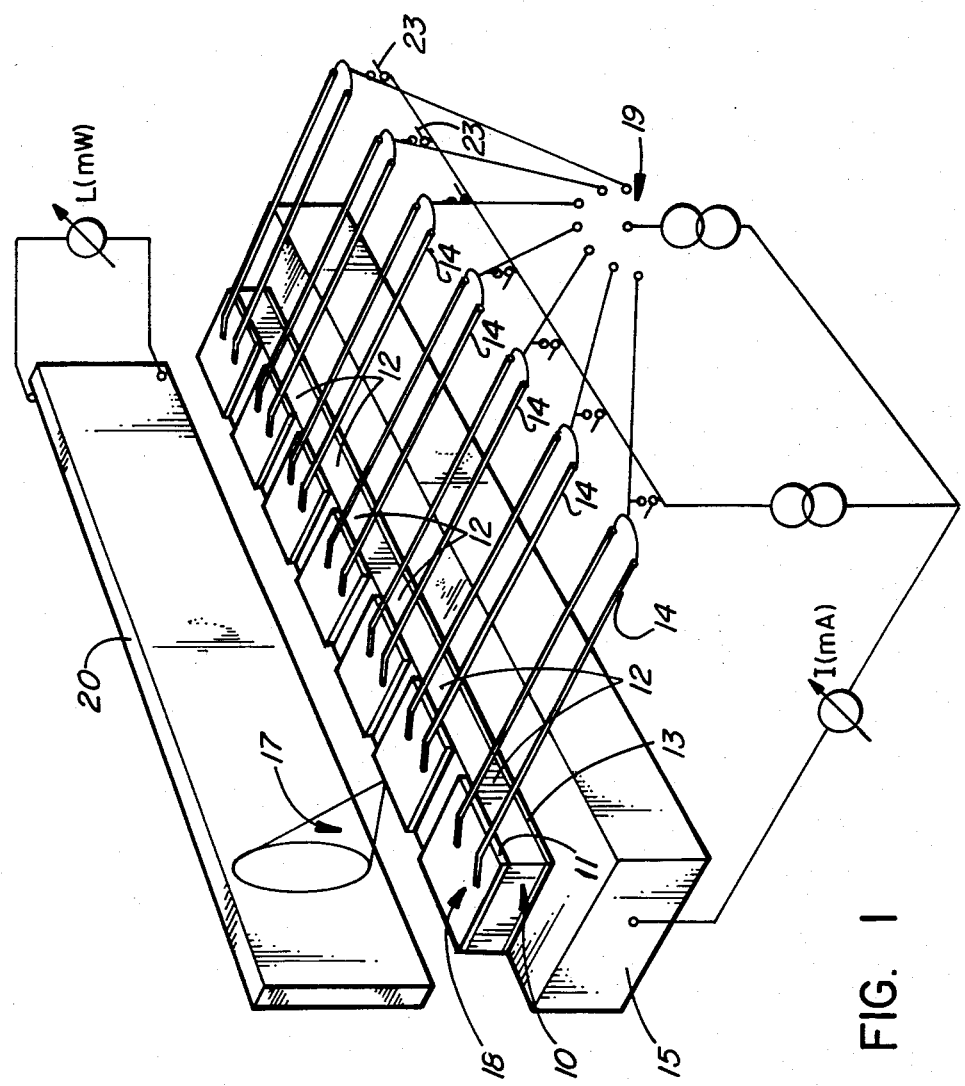

United States Patent [19]

Chik et al.

[11] Patent Number: 4,489,477
[45] Date of Patent: Dec. 25, 1984

[54] METHOD FOR SCREENING LASER DIODES

[75] Inventors: Kiu-Chi D. Chik; Tibor F. Devenyi, both of Nepean; John C. Dyment, Kanata, all of Canada

[73] Assignee: Northern Telecom Limited, Montreal, Canada

[21] Appl. No.: 582,956

[22] Filed: Feb. 23, 1984

[51] Int. Cl.³ ............................................. G01R 31/36
[52] U.S. Cl. ................................... 29/569 L; 29/574; 324/158 D
[58] Field of Search ..................... 29/569 L, 574, 583, 29/589, 590; 324/158 D; 357/69, 70, 81

[56] References Cited

U.S. PATENT DOCUMENTS

| | | | |
|---|---|---|---|
| 3,736,506 | 5/1973 | Griffin | 29/574 |
| 3,795,045 | 3/1974 | Dumas | 29/574 |
| 3,840,809 | 10/1974 | Yun | 324/158 D |
| 4,346,347 | 8/1982 | Kamata et al. | 324/158 D |
| 4,441,248 | 4/1984 | Sherman et al. | 29/574 |

FOREIGN PATENT DOCUMENTS

| | | | |
|---|---|---|---|
| 54-138377 | 10/1979 | Japan | 29/574 |
| 57-63839 | 4/1982 | Japan | 29/574 |
| 58-70542 | 4/1983 | Japan | 29/574 |

Primary Examiner—Brian E. Hearn
Assistant Examiner—Hunter L. Auyang
Attorney, Agent, or Firm—Stuart L. Wilkinson

[57] ABSTRACT

A method for screening double heterostructure laser diodes before mounting and packaging is disclosed. At a normal laser diode operating temperature, a range of pulsed current is passed through the laser diode and the lasing threshold current and slope efficiency of the laser diode are monitored. The laser diode is then subjected to a burn-in process in which it is driven at a high junction temperature for an extended time period. Subsequently the lasing threshold current and slope efficiency are again monitored by applying the same range of pulsed current at the normal operating temperature. If either the threshold current or the slope efficiency have changed by more than a predetermined amount, the laser diode is rejected. Otherwise, the laser diode is gauged as likely to have a lifetime greater than a predetermined value at normal operating conditions so warranting further testing prior to installation into a laser package.

5 Claims, 5 Drawing Figures

METHOD FOR SCREENING LASER DIODES

This invention relates to a method for screening laser diodes in order that those devices likely to have an unacceptably short lifetime can be rejected at an early stage in the fabrication of a laser package.

In manufacturing double heterostructure lasers for use in fiber optic communications, the primary steps are: growing and processing double heterostructure on a III–V substrate by, for example, liquid phase epitaxy; cleaving the processed wafer into bars containing many laser diodes; coating the two exposed cleaved facets of the bar; cleaving individual chips from the bar, bonding each chip to a heat sink; and then bonding electrical leads to the chips.

At all stages of the manufacturing process, the various interim products must be tested and known life test procedures are time consuming and unreliable. In some cases even those lasers which have been judged acceptable after being subjected to many hours of testing have been found to fail quickly when installed in the field.

On the other hand, some short wavelength GaAlAs/GaAs double heterostructure laser diodes have been shown to have lifetime values of more than $10^4$ hours at 70° C. under continuous operation. Practically and commercially then, a very useful test is the screening of lasers at an early stage in order to discard those lasers which can be expected to exhibit unacceptably low lifetimes.

According to one aspect of the invention there is provided a method of screening a double heterostructure laser diode, the method comprising the steps of:
  subjecting a laser diode to a range of currents at a normal junction operating temperature and measuring laser diode light output to monitor lasing threshold current and laser slope efficiency of the laser diode;
  subjecting the laser diode to a burn-in process at a substantially higher junction temperature and a relatively high operating current for an extended time;
  subjecting the laser diode at the normal junction operating temperature to said range of currents and measuring the laser light output to find the lasing threshold current and slope efficiency of the laser diode after the burn-in process;
  determining any change in lasing threshold current and slope efficiency as between the first and second measuring steps; and
  continuing the laser diode testing and manufacturing process only for those laser diodes having a threshold change and a slope efficiency change less than predetermined critical values.

The threshold currents derived before and after the burn-in process should not differ by more than 2 milliamps. In addition, the slope efficiencies before and after the burn-in process should not degrade by more than 5%.

For the measurement of lasing threshold and slope efficiency, pulsed current and normal junction temperature are used. During the burn-in process, DC current and high junction temperature are used.

Laser diode screening can be carried out after the laser diodes have been cleaved from a double heterostructure wafer as individual chips or, for ease of handling, the screening can be carried out on a set of laser diodes occupying an integral bar or strip cleaved from the wafer. The bar has a bottom surface coated with a contact metal such as gold to provide good thermal and electrical contact when the bar is disposed on a gold plated heat sink header. The top metallized surface of the bar is divided into contact pads in order to electrically isolate the individual laser diodes from one another. Current can be fed to the top surfaces of the devices through probes which are configured to promote even current distribution across the area of the laser diodes.

Figure 2:
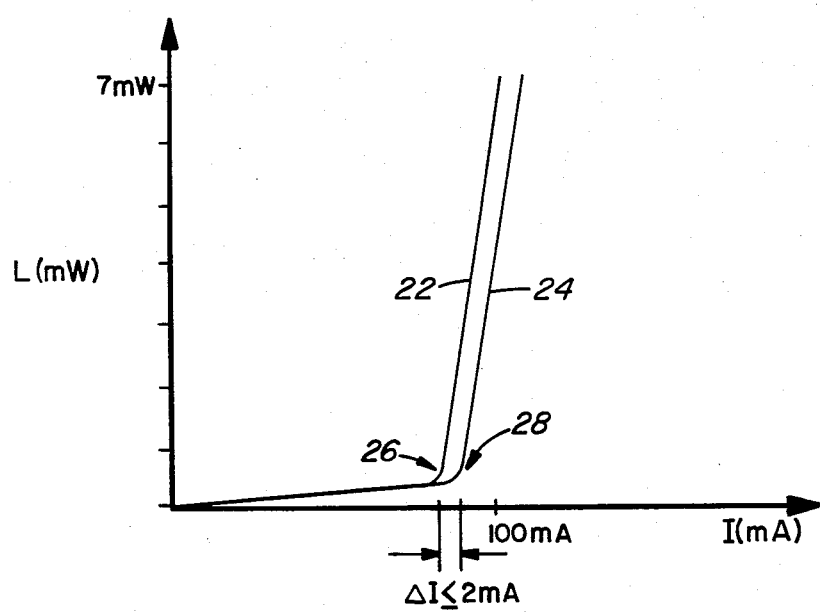
Figure 3:
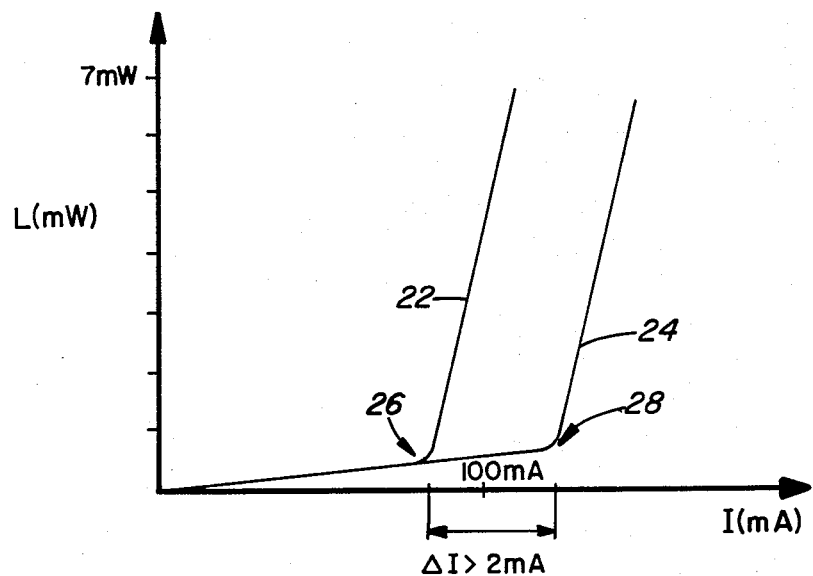
Figure 4:
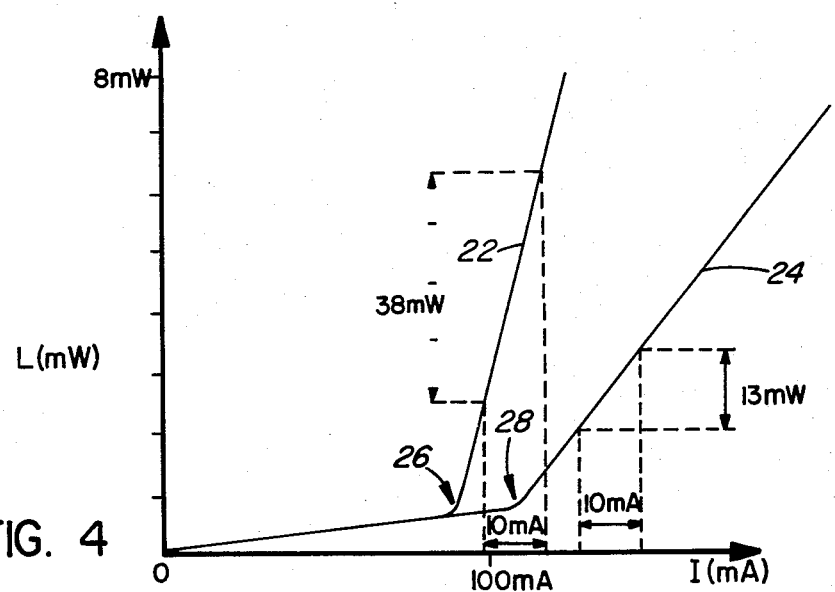
Figure 5:
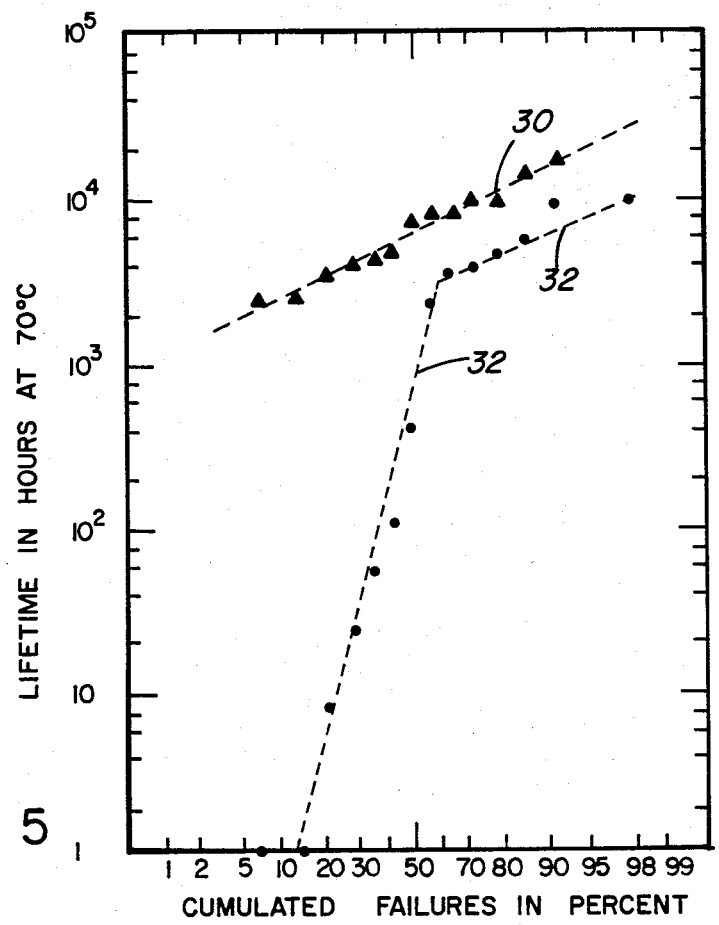

An embodiment of the invention will now be described by way of example with reference to the accompanying drawings, in which:
  FIG. 1 is a part schematic, plan view showing the testing of a bar of laser diodes cleaved from a double heterostructure wafer;
  FIG. 2 shows a plot of light output against current input for a laser diode judged acceptable using a test method according to the invention;
  FIG. 3 shows the light output against current input plot for a laser diode judged unacceptable using the test method;
  FIG. 4 shows the light output against current input plot for another laser diode judged unacceptable using the test method; and
  FIG. 5 shows a log normal plot showing percentage failure as a function of device lifetime for screened and unscreened lasers.

Referring in detail to the drawings, FIG. 1 shows in plan view a strip or bar 10 of several double heterostructure laser diodes 12. The laser diodes are fabricated on a semiconductor slice using one of a number of known epitaxial growth techniques such as liquid phase epitaxy. The double heterostructure is formed on the semiconductor substrate as a first confining layer, an active layer, and a second confining layer. Optionally, blocking and capping layers are epitaxially grown over the second confining layer. For a short wavelength GaAs/GaAlAs laser diode having an output wavelength of about 0.84 microns, the first confining layer formed on a GaAs substrate is n-type GaAlAs, the active layer is p-type GaAs, and the second confining layer is p-type GaAlAs. Highly conducting contact layers 11 and 13 are then formed on opposed surfaces of the slice.

In device operation, the pn junction emits light when forward biased, the second confining layer acts to limit carrier diffusion away from the active layer, and both confining layers, by virtue of their relatively low refractive index, act to retain light within the active layer. The practical implementation and operation of laser diodes particularly for use in fiber optic systems, are well known and will not be described in detail here.

Following completion of wafer processing, the p-side contact 11 of the double heterostructure wafer is then scribed or photoengraved to mark out the individual laser diodes 12 and to render the laser diodes electrically isolated from one another. The wafer is then diced initially into strips or bars 10 of laser diodes and then into individual chips. For ease of handling, it is in the strip or bar form that the laser diodes are tested.

As shown in FIG. 1, the laser diodes are energized using a row of probes 14 through which current is fed to the p-side of the devices. The contact layer 13 on the n-side of the laser diodes provides good thermal and electrical contact with a gold plated temperature controlled heatsink 15 on which the laser diodes 12 rest. When testing a device, current passed into the top surface flows across the pn junction and out of the device into the heat sink 15. To promote even current distribution over the area of each device, double probes are used. To minimize contact resistance the probes are periodically cleaned with abrasive. Since the devices are very small, the probes are positioned manually under a microscope, although this positioning step can be automated if production volume so warrants. Before testing, the laser diodes are marked by scratching or painting so that a particular test result can be properly related to the device under test.

When passing current through a laser diode, light 17 is emitted from its output facets 18. The light is monitored at a light detector 20 mounted parallel to the laser diode output facets 18. For short wavelength devices of the order of 0.85 microns output wavelength, a silicon based photocell is used while for longer wavelength devices of the order of 1.3 microns output wavelength, a germanium based photocell is used.

The test on each laser diode falls into three stages. Firstly using selector switch 19 the laser diodes are individually subjected to a pulsed operating current corresponding to a power range from 0 to 12 milliwatts at a junction temperature of about 30° C., this temperature being essentially the normal operating temperature of the laser diodes when installed and operating in a fiber optic system. A light output against current input plot is generated and is shown for three distinct laser diodes at 22 in FIGS. 2 to 4 inclusive.

In the second, or burn-in step, using switches 23 each laser diode is subjected to a DC current corresponding to a junction current density about 10 kA/cm$^2$ at a junction temperature of about 165° C., this burn-in condition being maintained for an extended time period of about two hours. During this time, the laser diodes operate in the LED mode and the emitted light is not measured.

In the third stage, the laser diodes are individually subjected to conditions essentially the same as those of the first monitoring stage and a corresponding plot is obtained as shown for the three test laser diodes at 24 in FIGS. 2 to 4 inclusive.

The plots of FIGS. 2 to 4 each show a sudden change of slope which signifies the laser threshold position 26, 28. Also the plots illustrate the laser efficiency slope which is the substantially linear regime above the laser threshold position.

As is evident from FIG. 2, the two lasing threshold positions 26 and 28 are closer than 2 milliamps. Similarly the two slope efficiencies are closer than 5%. Comparing FIGS. 3 and 4 which show corresponding plots for two different lasers, FIG. 3 shows an example in which the threshold change is greater than 2 milliamps but the slope efficiency change is less than 5%, whereas FIG. 4 shows an example having a change in laser slope efficiency greater than 5% and a threshold change of about 2 milliamps.

A laser diode having a threshold increase greater than 2 milliamps and/or a slope efficiency increase greater than 5% is judged unacceptable by the test method applied to GaAs/GaAlAs laser diodes.

The success of the screening method is shown by FIG. 5 which illustrates the log normal plots of laser lifetimes for screened 30 and unscreened 32 laser lifetimes obtained under constant optical output power of 5 milliwatts at 70° C. heat sink temperature. The plot shows that in the unscreened case there are two distinct groups of devices with clear differences in operating lifetimes. Detailed studies of the lasers have confirmed that the laser lifetimes from the two groups are determined by different crystal defect related failure mechanisms. For the screened lasers from the same wafer, the group with the shorter lifetimes is absent. Thus median lifetime at 70° C. heat sink temperature has been increased from 600 to 6,000 hours and, more importantly, the lifetime distribution is greatly improved. This is indicated by a standard deviation of $\alpha=0.7$ in the log of the lifetime of screened lasers as compared with $\alpha=4.0$ for the unscreened devices.

Accelerated lifetime testing has shown that most of the screened lasers meet a typical lifetime requirement of greater than fifty years whereas none of the lasers which failed the screening test has done so. It is estimated that the burn-in step associated with screening procedures is relatively harmless and reduces the median lifetime of acceptable devices by less than 0.1%.

With regard to long wavelength laser diodes of the order of 1.3 microns in output wavelength, a similar screening procedure can be adopted. Quantitatively, the test conditions require some variation so that typically for laser diodes fabricated on an indium phosphide substrate, the diodes in the monitoring steps are driven through a range from 0 to 6 milliwatts output power and in the burn-in process a junction temperature of 165° C. is maintained for sixteen hours.

The figures given for junction temperature and burn-in time are those which have been found generally to exclude those devices which fail owing to one type of failure mechanism. A function of the burn-in time and the selected test criteria is therefore a certain expected median lifetime for laser diodes. It appears probable from FIG. 5 that burn-in conditions can be made more or less severe to obtain a range of devices with respectively a higher or lower expected median lifetime. In addition, although it has been determined that there is a relationship between device lifetime and changes in lasing threshold and slope efficiency following burn-in, the relationship is not an accurately predictable one since the failure mechanisms are many and varied and differ from diode to diode. Moreover, depending on the particular optical system within which a laser diode finds practical application, the lifetime specified for the system may vary. Thus the method can be altered to set a screening laser threshold change greater than 2 milliamps resulting both in reduced laser diode acceptance rate and a higher expected median lifetime for acceptable devices. Conversely a lasing threshold change can be set at a value less than 2 milliamps resulting in a lower expected median lifetime. Similarly the laser slope efficiency tolerance before and after burn-in can be set at greater or less than 5%. Again the result is respectively a higher and lower expected median lifetime.

What is claimed is:

1. A method of screening double heterostructure laser diodes, the method comprising:
   subjecting a laser diode to a range of currents at a laser pn normal junction operating temperature and monitoring lasing threshold current and lasing slope efficiency for the laser diodes;
   subjecting the laser diode to a burn-in process at a substantially higher junction temperature and a relatively high operating current for an extended time;
   subjecting the laser diode at the laser pn normal junction operating temperature to said range of currents and measuring laser light output to monitor the lasing threshold current and lasing slope efficiency of the laser diode after the burn-in process;

determining any change in laser threshold current and slope efficiency as between the first and second monitoring steps; and continuing a laser diode manufacturing process only for those laser diodes having a threshold increase and slope efficiency decrease less than a predetermined critical value.

2. A method as claimed in claim 1 in which in the monitoring steps, the applied current is a pulse current and, in the burn-in process, the applied current is a DC current.

3. A method as claimed in claim 1 in which the laser diodes are cleaved from a wafer as a bar consisting of several diodes and the laser diodes are subjected to the monitoring and burn-in process while in the form of the bar using a linear array of probes.

4. A method as claimed in claim 3 in which the bar is placed on a heat sink with lower contact faces of the diodes in electrical and thermal contact with the heat sink, and the probes are applied to upper contact faces of the diodes, said probes and the heat sink being contained within an electrical drive circuit.

5. A method as claimed in claim 4 in which each probe has a plurality of probe tips whereby to distribute current flow over the area of the individual diodes.

* * * * *